United States Patent
Spano et al.

(10) Patent No.: US 11,174,568 B2
(45) Date of Patent: Nov. 16, 2021

(54) MICROFLUIDIC CHIP FOR THE CRYSTALLISATION OF MOLECULES, PREPARATION METHOD, DEVICE COMPRISING SAID CHIP AND METHOD FOR CRYSTALLISATION OF MOLECULES

(71) Applicants: UNIVERSITE GRENOBLE ALPES, Saint Martin d'Heres (FR); COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR); RHODIA OPERATIONS, Aubervilliers (FR); RHODIA LABORATOIRE DU FUTUR, Pessac (FR); UNIVERSITE DE BORDEAUX, Bordeaux (FR)

(72) Inventors: Monika Spano, Charavines (FR); Jean-Baptiste Salmon, Bordeaux (FR); Niels Heinz Junius, Grenoble (FR)

(73) Assignees: UNIVERSITE GRENOBLE ALPES, Saint-Martin-d'Heres (FR); COMMISSARIAT A L'ENERGIE ATOMIQUE ET AUX ENERGIES, Paris (FR); LTERNATIVES CENTRE NATIONAL DE LA RECHERCHE, Paris (FR); SCIENTIFIQUE RHODIA OPERATIONS, Aubervilliers (FR); RHODIA LABORATOIRE DU FUTUR, Pessac (FR); UNIVERSITE DE BORDEAUX, Bordeaux (FR)

( * ) Notice: Subject to any disclaimer, the term of this patent is extended or adjusted under 35 U.S.C. 154(b) by 385 days.

(21) Appl. No.: 15/780,923

(22) PCT Filed: Dec. 2, 2016

(86) PCT No.: PCT/FR2016/053185
§ 371 (c)(1),
(2) Date: Jun. 1, 2018

(87) PCT Pub. No.: WO2017/093689
PCT Pub. Date: Jun. 8, 2017

(65) Prior Publication Data
US 2018/0355512 A1   Dec. 13, 2018

(30) Foreign Application Priority Data
Dec. 2, 2015   (FR) .................................. 1561715

(51) Int. Cl.
*C30B 29/58*   (2006.01)
*B01L 3/00*   (2006.01)
(Continued)

(52) U.S. Cl.
CPC ........ *C30B 29/58* (2013.01); *B01L 3/502753* (2013.01); *C30B 7/08* (2013.01);
(Continued)

(58) Field of Classification Search
CPC ....... B01L 2300/0887; B01L 3/502753; B63B 25/08; C30B 29/58; C30B 7/08;
(Continued)

(56) References Cited

U.S. PATENT DOCUMENTS

2004/0048388 A1* 3/2004 Gilbert .............. B01L 3/502753
                                                       436/86
2005/0019794 A1* 1/2005 Nassef .................... C30B 29/54
                                                       435/6.11
(Continued)

FOREIGN PATENT DOCUMENTS

FR         2 964 671        3/2012
WO    WO 2004/023106        3/2004
WO       2007069586 A1      6/2007

OTHER PUBLICATIONS

International Search Report dated Jan. 18, 2017 from corresponding application No. PCT/FR2016/053185.
(Continued)

*Primary Examiner* — Matthew J Song
(74) *Attorney, Agent, or Firm* — Hauptman Ham, LLP

(57) ABSTRACT

A microfluidic chip comprising at least one dialysis crystallisation cell. The cell includes: a substrate made of PMMA; a first level including a tank defined at least partially by the substrate and by an outer wall of the cell, the
(Continued)

tank being in fluid communication with a channel for inlet and a channel for outlet of a solution allowing the crystallisation method to be implemented; and a second level including a dialysis chamber defined at least partially by an inner wall of the cell without contact with the substrate and by a dialysis membrane forming an interface between the tank and the dialysis chamber, the inner wall including at least one one-piece portion in which the periphery of the membrane is kept sealed.

14 Claims, 3 Drawing Sheets

(51) Int. Cl.
*C30B 7/08* (2006.01)
*C30B 7/14* (2006.01)
(52) U.S. Cl.
CPC .......... *C30B 7/14* (2013.01); *B01L 2300/0887* (2013.01); *F17C 2201/0157* (2013.01)
(58) Field of Classification Search
CPC .............. C30B 7/14; F17C 2201/0157; F17C 2201/052; F17C 2203/0358; F17C 2203/0631; F17C 2203/0643; F17C 2203/0646; F17C 2203/0651; F17C 2221/033; F17C 2223/0161; F17C 2223/033; F17C 2260/011; F17C 2270/0107; F17C 2270/0113; F17C 3/027
See application file for complete search history.

(56) References Cited

U.S. PATENT DOCUMENTS

| | | | |
|---|---|---|---|
| 2008/0249510 A1* | 10/2008 | Mescher | F16K 99/0042 604/890.1 |
| 2009/0045058 A1 | 2/2009 | Fujita et al. | |
| 2010/0179069 A1* | 7/2010 | Huang | B01L 3/502753 506/9 |
| 2012/0028342 A1* | 2/2012 | Ismagilov | C12Q 1/703 435/283.1 |
| 2014/0080206 A1* | 3/2014 | Dahan | G01N 33/5008 435/288.7 |
| 2018/0326417 A1* | 11/2018 | Wikswo | G01N 33/54366 |

OTHER PUBLICATIONS

Longuet Clothilde et al., "Spatially-Controlled Protein Crystallization in Microfluidic Chambers", Journal of Crystal Growth, vol. 386, Jan. 15, 2014, pp. 179-182, XP028776143, ISSN: 0022-0248.
Japanese Office Action issued in corresponding Japanese Patent Application No. 2018-529041, dated Feb. 1, 2021, pp. 1-2, Japanese Patent Office, Tokyo, Japan.

* cited by examiner

FIG. 3
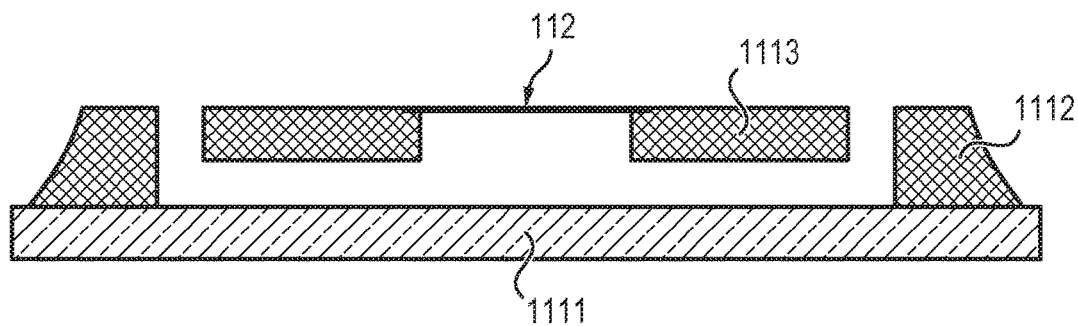
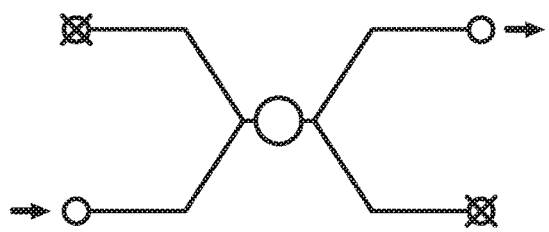
FIG. 4A
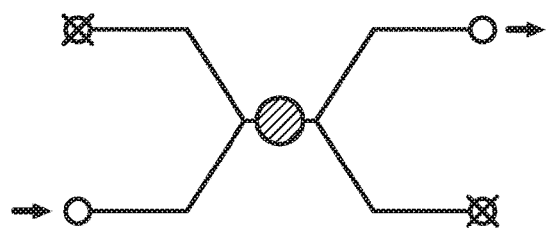
FIG. 4B
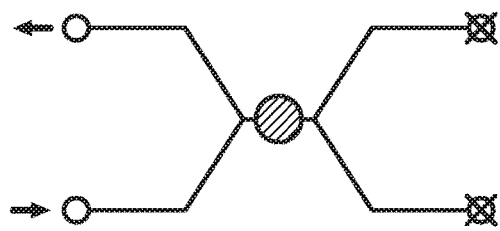
FIG. 4C
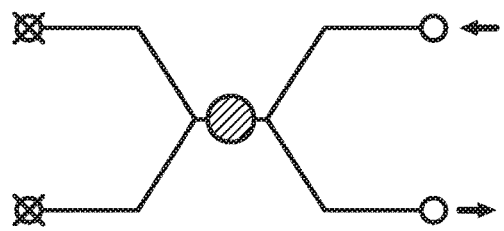
FIG. 4D

MICROFLUIDIC CHIP FOR THE CRYSTALLISATION OF MOLECULES, PREPARATION METHOD, DEVICE COMPRISING SAID CHIP AND METHOD FOR CRYSTALLISATION OF MOLECULES

RELATED APPLICATIONS

The present application is a National Phase of International Application Number PCT/FR2016/053185, filed Dec. 2, 2016, and claims the priority of French Application No. 1561715, filed Dec. 2, 2015.

FIELD OF THE INVENTION

The present invention relates to a microfluidic chip for the crystallisation of molecules, advantageously biological macromolecules, in particular proteins. Thus, the present invention relates to the field of crystallisation of molecules, advantageously biological macromolecules, such as proteins.

The biological activity of most proteins is determined by their 3D structure, that is to say, the manner in which the amino acids of the polypeptide chain are arranged with respect to each other in space. For example, a significant number of molecular diseases are caused by modifications in protein structure. Drugs work by binding to proteins, which leads to a modification of their functional structure while thus affecting their biological activity. The design and the improvement of drugs are greatly facilitated by the knowledge of the 3D structures of their macromolecular targets. The clarification of the 3D structures of the proteins is therefore of capital importance for understanding the underlying mechanisms of molecular diseases. In order to study this 3D structure, techniques of X-ray diffraction are substantially used.

The technique of diffraction requires the macromolecules to be studied to be in crystalline form, and more advantageously in the form of single crystals of good quality and sufficient volume.

In the context of the present invention, a single crystal of good quality means a single crystal having:
 low mosaicity,
 significant diffraction power (namely less than 2 angstrom),
 a size between 1 and 100 µm.

In order to obtain single crystals of good quality and sufficient volume, it is essential to control the crystallisation of the macromolecules (namely the crystallogenesis). The process of crystallisation deals with both the thermodynamic and kinetic characteristics in the multidimensional phase spaces. The thermodynamic data is the solubility curves, the presence of metastable phases, the polymorphs, liquid-liquid separation . . . And it is dependent on a plurality of parameters such as the temperature, the pH, the solvent, the impurities, etc. Moreover, the kinetic trajectories in the phase diagram are relevant to controlling most of the final properties of the crystals synthesised. The path followed in the phase diagram controls the nucleation and the growth of the crystals, and thus their number, the size and the morphology.

Crystallogenesis comprises two steps:
 a first step, called nucleation step, involving the appearance of crystalline seeds from a crystallisation solution.
 a second step, called growth step, involving the crystalline growth of the seeds of crystals obtained during the nucleation.

For a better understanding of the crystallisation, it is important to create a phase diagram of the molecule to be crystallised that is established on the basis of the temperature, the concentration of solute, and/or the concentration of precipitating agent. On such a type of diagram, four zones can be distinguished:
 The metastable zone, in which the solution is slightly oversaturated, and can be maintained this way for a very long time without the formation of crystals, but the seeded crystals grow therein;
 The zone of sub-saturation: Nucleation does not take place and the seeded crystals are dissolved;
 The zone of spontaneous nucleation: The excess of the molecule to be crystallised is separated from the solution of the molecule to be crystallised in the form of seeds of crystals (or, in other words, nucleis). The seeded crystals grow therein.
 The precipitation zone: a zone in which the oversaturation is so significant that the formation of the aggregates and of the precipitates is promoted therein before the formation of the crystals. The structures formed are disorderly. They are aggregates and/or precipitates.

The metastable zone, spontaneous nucleation zone and precipitation zone together form the zone called "oversaturation zone." The upper limit of the metastable zone (namely the border between the metastable zone and the spontaneous nucleation zone) is also called "metastability limit" or "supersolubility curve."

It was at first supposed that any protein that could be solubilised and purified would be relatively easy to crystallise. However, the results indicated that the solubility and the purity of the proteins, though important factors, do not guarantee a useful yield of crystals. The behaviour of the proteins during crystallisation has proved to be complex.

Nevertheless, today, the growth of the macromolecular crystals, and thus the growing production of the crystals of the proteins, of the nucleic acids, and of the viruses, is a tool of molecular and structural biologists. The structure-function correlation is now a must in enzymology, just like the design of the drugs based on the crystalline structures of the complexes is becoming indispensable. The use of the crystallographic results to explain and describe natural phenomena continues to grow, the extension of the methods to the more complicated structural problems leads to an increase in attempts to crystallise even more macromolecules. This in turn leads to a need for more efficient and faster techniques for growing these crystals.

The setting up of the protein crystallisation trials and the analysis of the results has become for the most part automated. The crystallisation laboratory can thus involve the use:
of distribution robots: distribution of a tank solution, distribution of a crystallisation drop, distribution of a tank solution and of a crystallisation drop
of imaging robots varying from semiautomatic microscopes to fully automated incubators.

When the crystals are found, an evaluation must be carried out in order to determine whether the crystals are indeed crystals of proteins or of a non-protein type (e.g. crystals of salt). And the quality of the crystal must be evaluated, as well as its usefulness for the collection of the diffraction data. This analysis is preferably carried out in situ. In the last few years, three new techniques were developed in this field: in situ analysis of diffraction (Skarzynski, 2009; Le Maire et al., 2011), UV detection (Judge et al., 2005; Debois et al., 2013) and microscopy of the second harmonic (SONICC; Wampler et al., 2008; Kissick et al., 2011).

In parallel to the automation involving numerous crystallisation laboratories, the last link in "the pipeline" of the analysis of proteins is the analysis of diffraction in the beam of X-rays. And this portion has also become automated. Today, the assembly and freezing of crystals is even possible using standard crystallisation plates in the SBS format, using a gripper made of kapton attached onto a robot arm (Heidari Khajepour et al.; 2012). The crystals assembled in the laboratory of the user are packaged in a specific Dewar, their assembly being compatible with the arm of the robot of the line of light in which the crystals will be analysed, and they are sent to the synchrotron.

Crystallisation platforms that comprise the vapour diffusion plates (Bingel-Erlenmeyer et al., 2011; Axford et al., 2012; Cipriani et al., 2012), the microfluidic chips (Pinker et al., 2013; Heymann et al., 2014; Perry et al., 2014), the acoustically loaded loops (Yin et al., 2014), the microcapillaries (Pineda-Molina et al., 2012) and with the nanodrops (Maeki et al., 2012) allow at least in principle, the crystals to be tested in situ, an important consideration during the screening of the quality of X-ray diffraction.

Due to the intense synchrotron radiation, the cryocrystallography and the direct phasing methods, a single crystal may be enough. But this must be a very good crystal (crystal of very good crystalline quality), even if it is small (approximately ≤10 μm). The intense radiation can destroy a crystal of protein, even if it is frozen. The freezing itself can crack a crystal into pieces or increase the mosaicity thereof. Direct methods cannot be used if the crystal does not diffract at very high resolution. Therefore, problems remain, even for the less demanding structures.

Towards the Miniaturisation of the Crystallisation: Microfluidic Crystallisation Fluidic miniaturised tools allow unique control of the kinetic paths undergone in a phase diagram and an in-depth look at the processes of nucleation and growth of the crystals of inorganic and biological molecules.

The advantages of microfluidics are that the crystallisation is studied with specific goals: it can be desired to collect thermodynamic and kinetic data, or grow crystals that can be used with the goal of carrying out diffraction studies.

Indeed, microfluidics offers a range of tools that are useful for multiplying experiments and/or emphasising a specific point in order to reveal the fundamental mechanisms. Microfluidic technology is a toolbox for handling liquids in the networks of microchannels with the scales of 1-100 μm in length. These networks imitate the conventional experiments carried out in a laboratory, but with unequalled control in terms of the transport phenomena (Squires & Quake, 2005; Vilkner et al., 2004; Stone et al., 2004). In the specific context of crystallisation (Van der Woerd et al., 2003; Sauter et al., 2007), these microfluidic tools substantially allow the manipulation of aqueous solutions around the ambient temperature. Originally, the field of use was rather limited, but the constant progress in microfluidic technology now offers original functionalities that allow a scientist to:

1. Carry out the acquisition of data at a high bandwidth by using crystallisation tests with a volume as low as 1 nL;
2. Design the specific kinetic pathways by using excellent control of transfer of mass and transfer of heat caused by the reduction of the scales in terms of length and by the integration, on a chip, of the sensors and of the actuators;
3. Provide new experimental conditions to study crystallisation, without turbulence, without or with little effect of gravity, the confinement, and high surface/volume ratio. Moreover, the low volumes V used in microfluidics are of particular interest for nucleation. The average nucleation time ($\infty$ 1/V) can exceed the kinetics of growth of the crystals (Kashchiev et al., 1991) and a single nucleation event is therefore statistically observed. This mononuclear mechanism is essential for estimating the kinetics of nucleation and of studying the polymorphism.

Many drug targets are integral membrane proteins that are experimentally particularly demanding. For such difficult objects, few crystallisation platforms exist and few structures are resolved (Huang et al., 2015). Hundreds of very small crystals are often tested before a complete set of data can be collected because of the damage caused by the irradiation or by the freezing. The quality of the data thus obtained is often lower than that which could be collected with larger (Rice et al., 2000) or non-frozen crystals, tested via in situ diffraction at ambient temperature. By combining incomplete diffraction data, obtained from a plurality of isomorph crystals at ambient temperature, a complete set of the data can be obtained for determining the 3D structure. This approach eliminates the need to recover the crystals and freeze them, and at the same time prevents the negative effects caused by irradiation with collection of the diffraction data in series at ambient temperature. Consequently, it is therefore necessary to be able to increase the size, the quality of the crystal and design supports for growth of these crystals that eliminate any later manipulation of the crystals and allow in-situ diffraction experiments, in order to make the diffraction experiments significantly easier, faster and for a lesser cost.

Dialysis is a method for membrane separation of the molecules or the ions in solution just like reverse osmosis, ultrafiltration and electrodialysis. These techniques differ by the force used in order for the chemical species or the ions to be able to cross the semi-permeable membrane, that is to say, the relatively thin barrier separating two liquid media. The forces are a gradient of concentration in dialysis. The advantage of the latter lies in the fact that it does not lead to any energy consumption, and prevents the accumulation of components in the membrane, which makes continuous operation possible. Dialysis is a form of molecular filtration: it allows the molecules to be separated according to their size, by using semi-permeable membranes, the pores of which have a size smaller than the macromolecular dimensions. These pores let the small molecules, such as those of the solvent, salts, and small metabolites, diffuse through the membrane but block the passage of larger molecules.

Crystallisation via dialysis involves the placement of the molecule to be crystallised into a device that is sealed via a dialysis membrane. This thus allows the water, crystallisation agents, additives or buffers to diffuse on either side of the dialysis membrane while keeping the molecule to be crystallised in the device. The device is placed in a suitable container that encloses the crystallisation agents, the additives and the buffers. This technique via dialysis also takes into account both the "salting in" effects (at low ionic force, the solubility of the molecule to be crystallised increases when the ionic force increases) and the "salting out" effects (at high ionic force, the solubility of the molecule to be crystallised decreases when the ionic force increases), as well the pH.

The application WO2012/035268 describes a crystallisation device, in which the crystallisation is implemented by varying, in a controlled manner and in situ, the composition of the crystallisation solution. This implementation of the crystallisation presents the interest of requiring a volume of the sample of the molecule to be crystallised used in a single experiment that is smaller than in the conventional crystallisation techniques with the possibility of reusing it later. Indeed, the sample is not consumed during the crystallisation and the crystallisation conditions can be changed reversibly, as many times as the protein is not damaged (e.g. denatured) in the selected crystallisation conditions. This device comprises a dialysis cell and a tank allowing dialysis in a continuous flow against a solution having a controlled composition, allowing the control of chemical composition (e.g. concentration of the precipitant, pH, additives, . . . ). The device also allows precise control of the temperature, with the observation, in real time, of the crystallisation solutions. The system allows the exploration of a multitude of crystallisation conditions with the same sample of protein (15 µL of protein per experiment). This approach allows experiments in series instead of parallel experiments.

The goal of the present invention involves miniaturising such a device, in the form of a microfluidic chip and thus reaching an efficient method for crystallising macromolecules.

This chip can be directly placed in the radiation of a synchrotron, which allows the diffraction data on numerous isomorph crystals residing in the chip to be collected and the need to obtain big crystals to be eliminated. The diffraction of the X-rays can take place directly on the chip, at a controlled temperature (most often at ambient temperature), thus allowing the need for a freezing step to be eliminated; the freezing further being capable of degrading the crystal.

The method for crystallisation via dialysis, implemented with the chip according to the invention, further allows:
    the moment at which the crystallisation conditions are approached to be identified
    the behaviour of the seed crystals once they are formed and present in a solution of molecule to be crystallised to be known.

We aim to miniaturise the optimisation of the crystallisation of macromolecules, in particular biological, while allowing in situ diffraction. The miniaturisation allows various phenomena to be re-examined under new experimental conditions and the precise-control (e.g. temperature, concentration of the precipitant) elements to be integrated, and thus the kinetic path to be controlled according to the phase diagram, with high precision. This automated microfluidic crystallisation platform allows the obtaining of crystals to be accelerated and the crystalline quality to be increased while reducing the manipulations that said crystals undergo while minimising the volume of sample required.

Beyond the contribution of this work of microfabrication, and in particular with regard to the integration of dialysis membranes, the success of the project relates first and foremost to structural biology. The capacity of the microfluidic platform to collect crystallographic data in situ from a large number of crystals of proteins provides the possibility of using the synchrotron radiation not only for crystallography in series but also for time-resolved crystallography (Laue diffraction) and, consequently for the structural study of the dynamics of the biochemical reactions. The key issue comes from the integration of the capacities of the treatment of the fluids allowing the continuous flow to trigger the enzymatic reactions for a dynamic crystallographic analysis.

The definition of microfluidics that can be found in the Larousse dictionary is the following: "Branch of fluid mechanics that studies the fluids that circulate in channels having a diameter of several micrometers." It can be considered that a microfluidic system can be defined as such from the moment that one of its characteristic lengths is between 1 µm and 1 mm.

Flow in a Microchannel:

In microfluidics, it is necessary to take into account the effects of the flows in the microchannels. However, given the working dimensions, approximately from a micrometer to a millimeter, conventional physics is necessary even though the contact forces play a more important role on this scale than on the macroscopic scale.

The movement of a single-phase fluid in the hydrodynamic approach is governed by 2 equations. The equation for conservation of momentum (1) and the equation for conservation of mass (2).

$$\rho \frac{Du}{Dt} = \nabla \cdot \vec{\tau} + F \qquad (1)$$

With:
$\rho = \rho(x, t)$ density (kg·m−3)
$u = u(x, t)$ velocity (m·s−1)
$\vec{\tau} = \vec{\tau}(x, t) = (\tau_{ij})$ viscous stress tensor
F outside forces (N)

$$\frac{D\rho}{Dt} + \rho \nabla \cdot u = 0 \qquad (2)$$

$\frac{D}{Dt}$ is the particle derivative that can be found by considering a function f of space and of time. During a movement of a fluid particle for dt along x, the particle travels dx=x+vdt, thus giving:
Therefore $$df = f(x + vdt, t + dt) - f(x, t) = \frac{\partial f}{\partial x} dx + \frac{\partial f}{\partial t} dt \qquad (3)$$

$$df = \frac{\partial f}{\partial x} vdt + \frac{\partial f}{\partial t} dt \text{ hence}$$

$$\frac{Df}{Dt} = \frac{\partial f}{\partial x} v + \frac{\partial f}{\partial t}$$

In hydrodynamics, it is often considered that the fluid is incompressible when its velocity is much less than the speed of sound. However, in certain cases, it may be that it is impossible to consider the fluid as incompressible. This equation system can be completed by thermodynamic state equations or other conservation equations according to the system studied.

In the case of Newtonian fluids, the equation of conservation of momentum can be modified as follows:

$$\rho \frac{Du}{Dt} = -\nabla p + \mu \Delta u + F \qquad (4)$$

Here, the viscous stress tensor is connected in a simple manner to the velocity since this is a specific case, µ designates the dynamic viscosity of the fluid. The equation (4) is called the Navier-Stokes equation.

In the case of a channel having a rectangular cross-section, a width ω, a height h and a length L (very long with respect to ω and h), if the fluid is considered to be incompressible and there is a permanent flow with a flow velocity in the direction x, then it is deduced that:

$$\frac{dp}{dx} = \mu\left(\frac{\partial^2 u}{\partial y^2} + \frac{\partial^2 u}{\partial z^2}\right) \quad (5)$$

The pressure varies longitudinally and the pressure drop Δp for a length L of the channel can be introduced:

$$\frac{\Delta p}{L} = \frac{p - p0}{x - x0} \rightarrow \frac{\partial^2 u}{\partial y^2} + \frac{\partial^2 u}{\partial z^2} = \frac{-\Delta p}{\mu L} \quad (6)$$

In this particular case, by solving (6), the plane Poiseuille result is obtained for the velocity. By integrating over the rectangular cross-section, a relationship between the volume flow rate Q and the pressure drop is found.

This gives:

$$Q = \frac{\Delta p}{12 \mu L} \omega h^3 \quad (7)$$

By analogy to electric circuits, the notion of hydrodynamic resistance can finally be defined by considering that Q=R↔U=Ri The goal of the invention involves designing a microfluidic chip that integrates a dialysis membrane out of those most widely used in the crystallisation of the proteins, namely made of regenerated cellulose. This chip must also satisfy several constraints, it must:
- be designed from a material "transparent" to X-rays in the energies used in the synchrotron (not causing significant diffusion or absorption of the X-rays)
- be compatible with the biological material
- allow a small volume of protein, approximately or less than a microliter, to be contained
- have a channel through which the solution allowing the implementation of the crystallisation method can be introduced and modified in order to work under new conditions
- be temperature-controlled Indeed, the goal of this invention is to design a microfluidic tool for the crystallisation of the proteins that is a miniaturisation of an existing instrument allowing the control and the optimisation of the crystalline growth [device described in the application WO2012/035268].

The goal of the invention is the development of a sequential microfluidic platform for the crystallisation of the macromolecules such as proteins that combines the control of temperature and of chemical composition of the solution allowing the implementation of the crystallisation method via the method of dialysis in a user-friendly facility allowing for: i) the research of crystallisation conditions and their optimisation, ii) the monitoring of the crystallisation in situ based on the phase diagrams determined experimentally, iii) the analysis of the crystals in situ via X-ray diffraction and iv) the resolution of the structure of the proteins via "on chip" diffraction of the isomorph crystals via X-rays.

The goal is in particular to precisely and reversibly control the crystallisation via microdialysis and control of the temperature. This provides huge advantages, in particular for the crystallisation of the membrane proteins where both the protein and the detergent are costly. Such a device would also be extremely precious for the crystallisation in cubic phase, where the in-depth understanding of the space of phases would allow the best way of obtaining crystals to be found.

The patent application US 2014/080206 describes a microfluidic chip manufactured according to a method corresponding to comparative example 1. Such a chip does not comprise an inner wall comprising at least one portion made of a single piece and in which the periphery of the membrane is kept sealed. This system, however, is not satisfactory since it was observed that the membrane did not resist (peeled off) when liquid is poured on the chip.

The article longuet et al., "spatially-controlled protein crystallization in microfluidic chambers", journal of crystal growth, vol. 386, pages 179-182, describes a microfluidic chip made of PDMS, here the membrane is maintained between two blocks sealed via gluing. Such a chip does not comprise an inner wall comprising at least one portion made of a single piece and in which the periphery of the membrane is kept sealed. This system, however, is not satisfactory since it was observed that the membrane did not resist (peeled off) when liquid is poured on the chip.

BRIEF DESCRIPTION OF THE INVENTION

The object of the invention is a microfluidic chip 1 comprising at least one dialysis crystallisation cell 11, said cell 11 comprising:
  a substrate 1111 made of PMMA
  a first level comprising a tank 111 defined at least partially by said substrate 1111 and by an outer wall 1112 of the cell, said tank 111 being in fluid communication with a channel for inlet and a channel for outlet of a solution allowing the crystallisation method to be implemented,
  a second level comprising a dialysis chamber 113 defined at least partially by an inner wall 1113 of the cell without contact with the substrate 1111 and by a dialysis membrane 112 forming an interface between the tank 111 and the dialysis chamber 113, the inner wall 1113 comprising at least one one-piece portion in which the periphery of said membrane 112 is kept sealed.

Advantageously, the dialysis chamber contains a solution of molecule to be crystallised and in that the dialysis chamber is sealed by a layer of polymer made of PMMA 1115. There is advantageously a space between the outer walls 1112 and inner walls 1113 opening onto a main surface 1114 of the chip and in that this space, at the surface of the chip, is connected via a connector to the system for controlling the flows of the fluids 1116, The dialysis membrane is advantageously made of cellulose, more advantageously regenerated cellulose.

The volume of the dialysis chamber is advantageously between 0.1 and 1 μL.

The microfluidic chip 1 according to the invention advantageously comprises a plurality of dialysis crystallisation cells aligned in lines and columns.

The object of the invention is also a method for preparing a microfluidic chip 1 according to the invention, characterised in that it comprises the following successive steps:
  Creating two structured blocks made of cross-linked polymer permeable to air PL in order to obtain the 3D buffers made of said polymer PL of the upper portion that will define the dialysis chamber and of the lower portion of the chip that will define the channels and the tank(s), On the structured block with the channels and the tank(s), depositing one or more dry dialysis membranes, Placing the structured block without channels in a location corresponding to the structured block with the channels in such a way that the membrane is sandwiched therebetween, Depositing an NOA81® photosensitive resin on 3 sides between the two structured blocks and then initiating the cross-linking of said NOA81® resin, Removing the upper portion of the structured block with the assembly made of cross-linked resin by peeling both together from the lower structured block, Resealing the visible portion (without PL) with a strip of PMMA, Finalising the cross-linking of said NOA81® resin, Removing the last structured block The object of the invention is also a device for crystallising a molecule to be crystallised, comprising At least one microfluidic chip according to the invention At least one addition means arranged to add, into the dialysis chamber, a solution S1 comprising the molecule to be crystallised and optionally at least one buffer At least one means for the addition/arranged removal of crystallisation agent and/or of additive(s) and/or buffer (s) and thus of the composition of the solution allowing the implementation of the crystallisation method in the channels leading to the chamber of the tank At least one means for controlling the chemical composition of the solution in the tank, for example a means for dosing, for varying the concentration of the buffers, of the crystallisation agents and of the additives At least one means for controlling and varying the temperature of the microfluidic chip according to the invention Optionally at least one means for measuring the concentration of the molecule to be crystallised in the solution S1

At least one image-acquisition means

The object of the invention is also a method for crystallising a molecule to be crystallised, characterised in that it comprises the following successive steps:

a) A solution S1 comprising the molecule to be crystallised is added into the dialysis chamber 113 of the microfluidic chip 1 as defined according to the invention and then it is encapsulated.

b) If necessary, a solution S2 is continuously injected into the channels of said microfluidic chip 1, said solution S2 containing only the buffer, the injection pressure at the microfluidic channel is maintained at less than 400 mbar.

c) A crystallisation solution S3 is continuously injected into the channels of said microfluidic chip 1, the injection pressure at the microfluidic channel is maintained at less than 400 mbar.

The crystallisation solution S3 contains at least one crystallisation agent and if necessary one or more additives, and optionally a buffer. When the step b) of the method is carried out, the solution S3 comprises the buffer of the solution S2 and at least one crystallisation agent if necessary one or more additives.

Advantageously, during step a), the dialysis chamber is encapsulated via deposition of a strip of PMMA, then KAPTON® coating.

Advantageously:

During step a), if necessary during step b), the solution contained in the dialysis chamber, comprising said molecule to be crystallised, is at a first temperature T1 and at a concentration C1 of the molecule to be crystallised in such a way that the molecule to be crystallised is in the sub-saturation zone (below the solubility curve) of the phase diagram of said molecule to be crystallised established according to the parameters of the concentration of the molecule to be crystallised and the temperature. During step b), the buffer present in the solution S2 diffuses into the solution contained in the dialysis chamber and the molecule to be crystallised is still in said sub-saturation zone During step c), said crystallisation solution S3 contains, if necessary in addition to the buffer, at least one crystallisation agent and if necessary one or more additives at a constant concentration P, in such a way that the crystallisation agent and if necessary the additive diffuse into the solution contained in the dialysis chamber and in such a way that the molecule to be crystallised is in the spontaneous nucleation zone or at the upper limit of the metastable zone of the phase diagram of said molecule to be crystallised and seeds of the molecule to be crystallised appear;

And the method then comprises the following successive steps:

d) the temperature of the crystallisation cell 11 is increased to a temperature T2 in such a way that the nucleation is stopped and the molecule to be crystallised is in the metastable zone of the phase diagram of the molecule to be crystallised, e) if too many crystals form during step c), the temperature of the crystallisation cell 11 maybe increased to a temperature >12 in such a way that the molecule to be crystallised is in the sub-saturation zone, just below the solubility curve, again and the excess of small crystals is completely dissolved. Some selected crystals, having greater sizes undergo partial dissolution while avoiding complete dissolution and then grow in the metastable zone via the lowering of the temperature to the temperature T2 f) The crystal seeds are left to grow at the temperature T2 until a first equilibrium point E1, at which the size of the crystals remains constant, is obtained, the concentration of the molecule to be crystallised in the solution contained in the dialysis chamber that is reached thus being the concentration C2, g) The temperature of the crystallisation cell 11 is lowered to a temperature T3, in such a way that the crystals present in the dialysis chamber 113 are still in the metastable zone of the phase diagram of the molecule to be crystallised h) The crystal seeds and the crystals are left to grow at the temperature T3 until a second equilibrium point E2, at which the size of the crystals remains constant, is obtained, the concentration of the molecule to be crystallised in the solution contained in the dialysis chamber that is reached thus being the concentration C3 i) Steps f) to h) are optionally repeated j) The chip containing the crystals obtained after step h) or i) is recovered for the X-ray diffraction experiment in situ.

Advantageously:
During step a), if necessary during step b), the solution contained in the dialysis chamber is at a constant temperature T of the crystallisation cell 11 and at a concentration C1 of the molecule to be crystallised in such a way the molecule to be crystallised is in the sub-saturation zone (below the solubility curve) of the phase diagram of said molecule to be crystallised established according to the parameters of the concentration of the molecule to be crystallised and of the concentration of crystallisation agent and if necessary of the concentration of additive; during step b), the buffer present in the solution S2 diffuses into the solution contained in the dialysis chamber and the molecule to be crystallised is still in said sub-saturation zone During step c), said crystallisation solution S3 contains, if necessary in addition to the buffer, at least one crystallisation agent and if necessary one or more additives at a concentration P1 in the tank of the crystallisation cell, in such a way that the crystallisation agent and if necessary the additive diffuses into the solution contained in the dialysis chamber and in such a way that the molecule to be crystallised is in the spontaneous nucleation zone or at the upper limit of the metastable zone of the phase diagram of said molecule to be crystallised and seeds of the molecule to be crystallised appear;

In order to obtain the controlled spontaneous nucleation of the crystals, the following procedure is used: using the system for controlling the flows of the fluids, the crystallisation solution S3 is injected in a continuous flow with a concentration gradient of the crystallisation agent and if necessary the additive in such a way that at the concentration P1, only a few crystals are formed.

and the method then comprises the following successive steps:

d) The concentration of the crystallisation agent and if necessary of the additive is reduced to a concentration P2, in such a way that the nucleation is stopped and the molecule to be crystallised is in the metastable zone of said phase diagram of the molecule to be crystallised e) The crystal seeds are left to grow at the concentration P2 of the crystallisation agent and if necessary of the additive until a first equilibrium point E1, at which the size of the crystals remains constant, is obtained, the concentration of the molecule to be crystallised in the solution contained in the dialysis chamber that is reached thus being the concentration C2 f) The concentration of the crystallisation agent and if necessary of the additive is increased to a concentration P3, in such a way that the crystals present in the crystallisation cell 11 are still in the metastable zone of said phase diagram of the molecule to be crystallised, g) The crystal seeds and the crystals are left to grow at the concentration P3 of the crystallisation agent and if necessary of the additive until a second equilibrium point E2, at which the size of the crystals remains constant, is obtained, the concentration of the molecule to be crystallised in the solution contained in the dialysis chamber that is reached thus being the concentration C3, h) Steps d) to f) are optionally repeated i) The chip containing the crystals obtained after step g) or h) is recovered for the X-ray diffraction experiment in situ.

BRIEF DESCRIPTION OF THE DRAWINGS

FIG. 4. Diagram of the steps of filling the protein tank of a dialysis crystallisation cell according to comparative example 2. The crosses represent a closed inlet.

FIG. 4A: filling with a solution comprising the molecule to be crystallised.

FIG. 4B. the cell is filled with the solution comprising the molecule to be crystallised FIG. 4C. the paraffin oil is circulated in a first side of the cell FIG. 4D. the paraffin oil is circulated in the other side of the cell FIG. 5 diagram showing the microfluidic chip according to the invention deposited on Peltier elements: from one Peltier module to another, the temperature can be different. 1: chip according to the invention —2 Peltier module —21: copper block —211: water exchanger —212: Peltier wiring

DETAILED DESCRIPTION OF THE INVENTION

Figure 1:
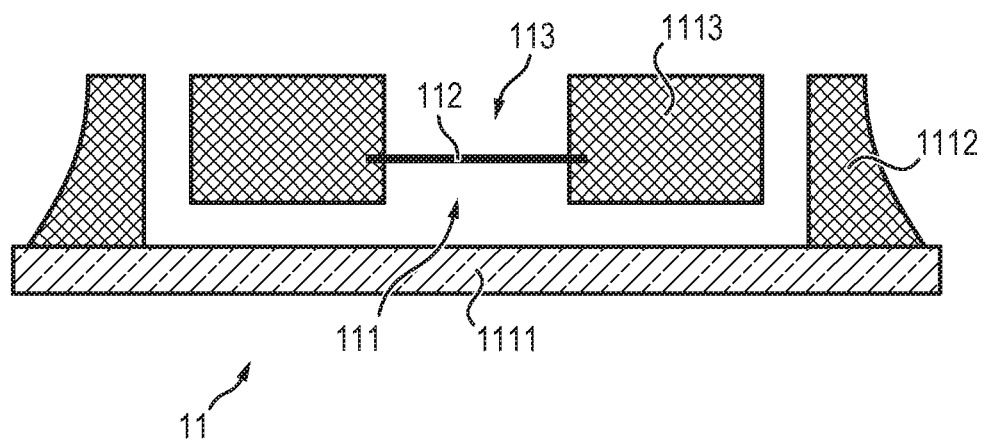
FIG. 1 dialysis crystallisation cell 11 according to the invention
Figure 2:
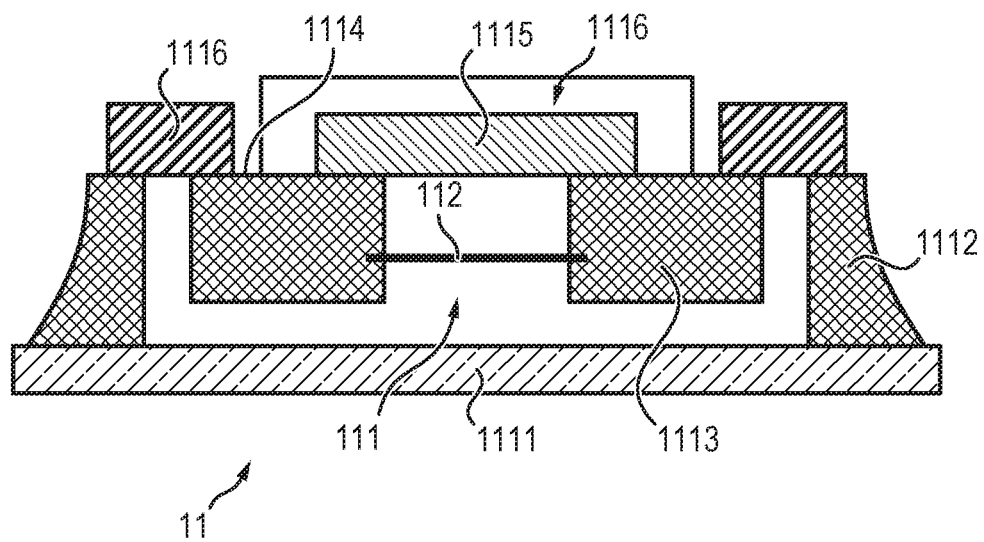
FIG. 2 specific embodiment of the dialysis crystallisation cell 11 according to the invention FIG. 3 dialysis crystallisation cell according to comparative example 1

The object of the invention is a microfluidic chip 1 comprising at least one dialysis crystallisation cell 11, said cell 11 comprising:

a substrate 1111 made of PMMA a first level comprising a tank 111 defined at least partially by said substrate 1111 and by an outer wall 1112 of the cell, said tank 111 being in fluid communication with a channel for inlet and a channel for outlet of a solution allowing the crystallisation method to be implemented, a second level comprising a dialysis chamber 113 defined at least partially by an inner wall 1113 of the cell without contact with the substrate 1111 and by a dialysis membrane 112 forming an interface between the tank 111 and the dialysis chamber 113, the inner wall 1113 comprising at least one one-piece portion in which the periphery of said membrane 112 is kept sealed.

A necessary feature of the chip 1 is that it allows the analysis and the monitoring of the crystallisation of the macromolecules via optical microscopy and via the analysis of the crystals via XR. This, it must consist of materials transparent with respect to optical microscopy and the X-rays, at least in the zones that will be observed through the microscope and placed in the synchrotron radiation.

The substrate of the chip is made of PMMA (poly(methyl methacrylate)). PMMA is chosen for its properties of transparency to optical microscopy and to X-rays. This polymer can also be used to seal the dialysis chamber 113 after deposition of the solution comprising the macromolecule to be crystallised.

Advantageously, the microfluidic chip 1 according to the invention is characterised in that the dialysis chamber contains a solution of molecule to be crystallised and in that the dialysis chamber is sealed by a layer made of a polymer transparent to X-rays and to optical microscopy 1115, PMMA.

This molecule is advantageously a macromolecule, more advantageously a biological macromolecule, in particular a protein. However, the chip and the method according to the invention can also be used for other molecules, for example such as colloidal particles or a molecule that is difficult to crystallise.

PMMA has numerous advantages, including three main ones: it is transparent, impermeable to air and strong:
very high transparency, very clear;
excellent optical property (light transmission greater than that of glass up to the near-UV, transparency, limpidity, brightness). Refractive index of 1.49; it is transparent to X-rays (does not cause significant diffusion or absorption of the X-rays)
excellent resistance to atmospheric agents;
excellent resistance to ultraviolet rays and corrosion.

On this substrate, the patterns, namely the tank 111, the channels, the dialysis chamber 113, are advantageously formed from a photosensitive resin transparent to optical microscopy.

At present, NOA81® is used. Norland Optical Adhesive 81® or NOA81® is a photosensitive resin that cross-links in several seconds. It is transparent and its advantage in this case comes from the fact that oxygen inhibits the polymerisation of the free radicals used to build the network of the polymer. This property makes it possible to have chips having a plurality of levels or the chip to be resealed using a thin strip of PMMA on top of which a fine layer of adhesive Kapton is advantageously applied.

The tank 111 is intended to receive a solution allowing the crystallisation method to be implemented. Such a solution comprises at least one component chosen from the group consisting of crystallisation agents, additives and buffers.

In the context of the present invention, crystallisation agent means agents that promote the crystallisation of the molecule to be crystallised. These can be:
salts, such as ammonium sulphate, sodium chloride, potassium phosphate;
organic compounds, such as isopropanol and 2-methyl-2, 4-pentanediol (MPD);
polyethylene glycol, such as PEG 4000, PEG 6000, or PEG 8000.

In the context of the present invention, additive means components allowing the stability of the molecule to be crystallised and/or the homogeneity of its conformation to be increased. These can be detergents, reducing agents, substrates, and cofactors such as the n-alkyl-glucosides or n-alkyl-maltosides, dithiotreitol (DTT), lipids, subunits or prosthetic groups.

In the context of the present invention, buffer means a component allowing a solution to which it was added to be maintained at a fixed pH. This can be 2-(N-morpholino) Ethane Sulfonic Acid (hereinafter abbreviated as "MES"), 2-amino-2-hydroxymethyl-1, 3-propanediol (hereinafter abbreviated as "Tris"), 2-(Bis(2-hydroxyethyl)amino)acetic acid (abbreviated as "Bicine"), 4-(2-hydroxyethyl)-1-piperazine ethane sulfonic acid (abbreviated as "Hepes") or sodium citrate, sodium acetate or sodium cacodylate.

The solution allowing the crystallisation method to be implemented advantageously comprises salts. Indeed, it was brought to light that the transfer of the neutral solutes (e.g. PEGs) through the membranes in the presence of salt is significantly affected with respect to their transfer when they are alone in solution (Escoda et al., 2010; Savignac, 2010). The effects of salting-out or pore swelling must be taken into account in the dialysis methods, since they are capable of affecting the steric exclusion of the neutral solutes, such as PEGs, if solutions used in these methods contain salts, in particular at high salt concentrations.

The tank 111 is in communication with an inlet channel and an outlet channel that allow a solution allowing the implementation of the crystallisation method to be circulated, advantageously in the form of a continuous flow. When the chip 1 comprises a plurality of dialysis crystallisation cells 11, the latter can be connected to each other and thus the various tanks 111 are connected by the same main channel.

The solution allowing the implementation of the crystallisation method is advantageously injected as a continuous flow using a system for controlling the flows of the fluids to the tanks via flow rate or imposed pressure, once the complete microfluidic assembly is carried out.

The injection pressure maintained at the microfluidic channel, during the crystallisation method, is advantageously less than 400 mbar, it advantageously varies from 100 to 300 mbar. If the injection pressure is greater than 400-450 mbar, there is a risk of tearing or peeling of the dialysis membrane.

The dialysis membrane is advantageously made of cellulose (for example made of cuprophane, namely a regenerated cellulose), modified cellulose such as cellulose acetate, hemophane, or synthetically modified cellulose.

A membrane made of cellulose has the following properties: thinness, pores having a small diameter that allows the elimination of substances having a low molecular weight, a low cost, high chemical reactivity (because of the hydroxyl groups), low biocompatibility.

Modified cellulose has the following properties: lesser chemical reactivity, good biocompatibility, substitution of the hydroxyl groups, an increase in the size of the pores, an increase in the hydraulic permeability, elimination of substances having a greater molecular weight.

Since the standard regenerated cellulose (RC) is composed of a polymer of natural cellulose from cotton linters, these membranes are perfectly suitable for a wide range of laboratory dialyses. This type of transparent and flexible membrane with symmetrical porosity is economical and strong; ideal for desalting, buffer exchanges, macromolecular purifications and other general uses. Due to their wide range of chemical compatibility, the standard RC membranes can be used with diluted strong acids and bases, concentrated weak acids and bases, most alcohols and certain medium or diluted organic solvents, including DMSO. The RC can be used in a pH of 2 to 12 and at temperatures between 4° C. and 121° C.

In the case of organic membranes, the porous structure results from the spaces between the chains of polymer. The porosity of a membrane is defined as the ratio of the volume of the empty spaces with respect to the total volume of the matrix. This value depends on the size of the elementary components of the matrix, but also on the method of creating the membrane. A porous membrane must have very good mechanical strength while allowing a high permeation flow rate. The separation depends on the steric effects (that is to say, on a discrimination according to the size of the species to be retained), but also on the effects of electric charges resulting from the chemical nature of the membrane material.

In the context of the invention, the porosity of the membrane is chosen according to the size of the molecule to be crystallised. The dialysis membrane must allow passage of the crystallisation agent but block the molecule to be crystallised.

The membrane is integrated into the inner wall 1113, advantageously into the NOA81® resin, advantageously without chemical gluing. At the pressures mentioned later, no leaks or alteration in the pores of the membrane are observed.

In the sense of the invention, the periphery of the membrane is sealed in a one-piece portion of the inner wall; which means that the periphery of the membrane is inserted into a single block, advantageously which is formed during the cross-linking of the resin cast in the mould. This embodiment is opposed to the embodiments in which a membrane is maintained trapped between two distinct blocks maintained pressed against each other or to the embodiments in which a membrane is deposited on a block. In the invention, the upper and lower phase of the periphery of the membrane are sealed in the same one-piece portion of the inner wall, that is to say, in a single block, advantageously which is formed during the cross-linking of the resin cast in the mould.

"One-piece portion" thus means a monolithic portion, that is to say, not resulting from the gluing or the assembly of two initially distinct portions.

The dialysis chamber 113 is intended to receive the molecule to be crystallised, advantageously in the form of a solution S1. This molecule is advantageously a macromolecule.

Also, in the context of the present invention, macromolecules mean molecules having a molecular weight from several thousand daltons to several hundred thousand daltons. These can be sequences of nucleic acids of DNA or of RNA, fragments of viruses, proteins, complexes of proteins, protein-RNA complexes, protein-ligand complexes, or polypeptides. Moreover, the present invention can be successfully applied to the crystallisation of other types of molecules such as colloidal particles.

Advantageously, the molecule to be crystallised is chosen from sequences of nucleic acids of DNA or of RNA, fragments of viruses, proteins, in particular membrane proteins, complexes of proteins, protein-RNA complexes, protein-ligand complexes, or polypeptides.

The chip according to the invention is particularly suited for the crystallisation of proteins that are difficult to crystallise such as membrane proteins and macromolecular complexes, or for projects for which the optimisation of diffraction quality of the crystal remains difficult.

An example of a protein crystallised in the context of the invention is the lysozyme of chicken egg white.

For example, the lysozyme is solubilised in a buffer: sodium acetate, at a concentration of 100 mM. This allows a pH of the solution of 4 to be maintained. The concentration of the lysozyme is 30 mg/mL. The solution allowing the implementation of the crystallisation method is a solution comprising 0.9M NaCl, and 100 mM Na acetate buffer having a pH of 4.

After deposition of the solution of molecule to be crystallised, the dialysis chamber 113 is advantageously sealed by a layer of polymer transparent to XR, advantageously PMMA.

The space between the outer walls 1112 and inner walls 1113, which opens onto a main surface 1114 of the chip, is advantageously connected via a connector, located on the surface of the chip, to the system for controlling the flows of the fluids 1116. Via this connector, the solution of the crystallisation agents can be injected into the chip. This connector can be made of elastomer or metal (e.g. a needle). This surface is not analysed via XR, and it is therefore possible to use a material not transparent to XR.

In order to protect the dialysis chambers, it is possible, after having introduced the solution comprising the macromolecule to be crystallised, advantageously having deposited a layer of PMMA, to deposit an adhesive additional layer 1116, for example made of Kapton®. This Kapton® adhesive layer ensures the impermeability of the dialysis chambers to air.

Kapton® is a film of polyimide (polymer containing imide) developed by DuPont that can remain stable in a wide temperature range:

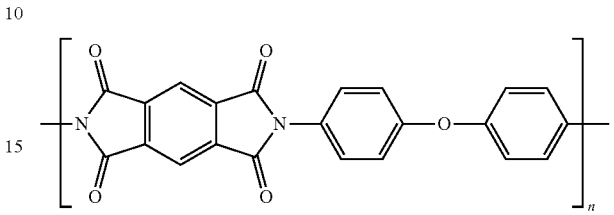

The volume of the dialysis chamber is advantageously between 0.1 and 1 µL.

The volume of the tank is the same as that of the dialysis chamber. Advantageously, its contents are renewed via the continuous flow in order to reach a volume hundreds or even thousands of times greater and in order to improve the dialysis method.

Due to the use of the expression "is between from X to XX", the endpoints, X and XX, are included.

According to an advantageous alternative of the invention, the microfluidic chip comprises a plurality of dialysis crystallisation cells aligned in lines and columns.

It is thus possible to vary, from one line to another, the concentration of crystallisation agent and/or additives in the precipitation solution and to vary, from one column to another, the temperature. It is thus possible to analyse the effect of the temperature, at a constant concentration, or the effect of the concentration, at a constant temperature, or the combined effect of a variation in temperature and in concentration.

Figure 5:
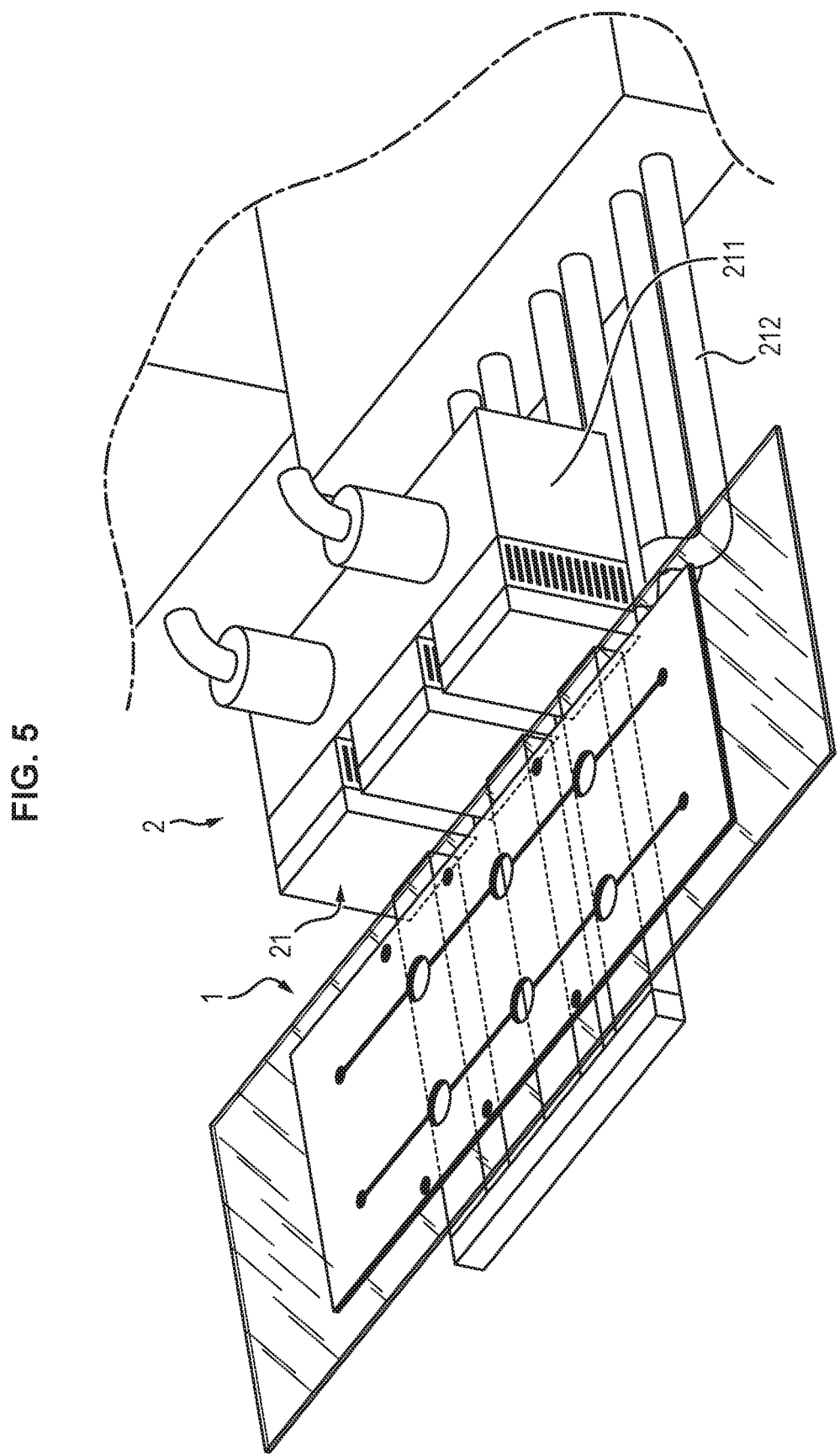

In order to allow the temperature from one cell to another to be varied, the crystallisation device comprises, beside the microfluidic chip 1, a system for controlling temperature, allowing the temperature to be controlled and varied; in particular a constant temperature different from one column to another to be applied. In one embodiment of the invention, the system for controlling the temperature is based on Peltier technology. This can be a Peltier-Effect Cell (PEC), also called thermoelectric module. Such an example is shown in FIG. 5.

The object of the invention is also a method for preparing a microfluidic chip 1 according to the invention, characterised in that it comprises the following successive steps:

Creating two PDMS structured blocks in order to obtain the 3D buffers made of PDMS of the upper portion that will define the dialysis chamber and of the lower portion of the chip that will define the channels and the tank(s), On the block of PDMS with the channels and the tank(s), depositing one or more dry dialysis membranes, Placing the structured block of PDMS without channels in a location corresponding to the block of PDMS with the channels in such a way that the membrane is sandwiched therebetween, Depositing the NOA81® on 3 sides between the two blocks of PDMS, Initiating the cross-linking of the NOA81®, Removing the upper portion made of PDMS with the assembly made of NOA81® by peeling both together from the lower block of the PDMS, Resealing the visible portion (without PDMS) with a strip of PMMA, Finalising the cross-linking of the NOA81®, Removing the last block of PDMS The step of initiating the cross-linking of the NOA81® must allow the NOA81® to be sufficiently polymerised to obtain a material that can be manipulated while hardening it the minimum. Indeed, there must be as little cross-linking as possible in order to allow gluing of the membrane and good cohesion of the membrane in the resin. The method is characterised in that the membrane is integrated into the resin. This can therefore be called non-chemical gluing. The later addition of the strip of PMMA followed by an additional time of cross-linking of the resin helps the gluing of the membrane.

Poly(dimethylsiloxane), also called PDMS, is a polymer that is in the form of a viscous liquid transparent to the eye. Its chemical formula is shown below:

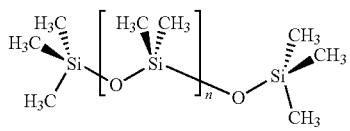

Once cross-linked (solidified), it has the particularity of being permeable to air and being sufficiently elastic.

There are two types of PDMS, RTV-615 PDMS and Sylgard 184 PDMS from Dow Corning. In both cases, it is necessary to mix it with a cross-linking agent and then heat it in order to activate the cross-linking of the material. The mixture is generally carried out in the weight proportions of 1:10 (cross-linking agent:PDMS), this ratio can, however, vary according to the use of the PDMS.

The object of the invention is also a device for crystallising a molecule to be crystallised, comprising At least one microfluidic chip according to the invention At least one addition means arranged to add, into the dialysis chamber, a solution S1 comprising the molecule to be crystallised and optionally at least one buffer (then finalisation of the chip via encapsulation of the dialysis chambers, as described above)

Optionally at least one means for controlling and varying the temperature of the microfluidic chip according to the invention Optionally at least one means for the addition/arranged removal of crystallisation agent and/or of additive(s) and/or buffer(s) (and thus of the chemical composition of the solution allowing the implementation of the crystallisation method in the channels leading to the chamber of the tank)

Optionally at least one means for controlling the chemical composition of the solution in the tank, for example a means for dosing, for varying the concentration of the buffers, of the crystallisation agents and of the additives At least one image-acquisition means Because of the addition means and/or removal means, the nature of the components that the solution injected into the tank contains (the crystallisation agents, the additives, the buffers) and the concentration of these components can vary during the crystallisation. The composition of the solution injected into the tank can be adjusted precisely by the operator carrying out the crystallisation. In order to decide the variations of the composition of the solution injected into the tank, the operator refers in particular to physico-chemical concepts determined according to the phase diagrams of the molecule to be crystallised.

The solution allowing the implementation of the crystallisation method is advantageously injected as a continuous flow using a system for controlling the flows of the fluids to the tanks via flow rate or imposed pressure, once the complete microfluidic assembly is carried out.

Because of the crystallisation device according to the invention, an optimisation of the nucleation and of the crystalline growth can be obtained by combining a dialysis method with precise variations in the temperature and in the composition of the solution injected into the tank that are decided by the operator on the basis of controls of the crystallisation parameters (the temperature, the concentration of the molecule to be crystallised and the composition of the solution injected into the tank) carried out during the crystallisation.

The invention thus provides a single platform for crystallisation, allowing precise control of all the parameters and their automation, promoting a process of miniaturisation via microfluidic technology. Carrying out the invention provides significant reductions in the cost of determining the three-dimensional structure of the biological macromolecules, being a crucial step in the multiscale approach of biological processes.

Before the implementation of the crystallisation method, it is possible to condition the microfluidic chip according to the invention. For example, it is possible to deposit the chip without any liquid in a plasma in order to clean it; vacuum (by using for example a vacuum pump), in order to evacuate the air from the chamber then once the desired pressure has been reached (in the context of the invention, a vacuum at 0.7 mbar is suitable) the electric coil creates the plasma. The plasma is a partially ionised gas composed of electrons, the ions and the neutral atoms or molecules. The plasma creates reactive species on the surface of certain materials (e.g. glass and PDMS) that, when put together, can form a permanent bond. In the context of the invention, the plasma transforms the surfaces of the membranes in order to facilitate the hydrophilic wetting, which facilitates the addition of liquids. Moreover, the plasma sterilises the microfluidic devices. The chip can for example be treated with plasma for 1 minute.

This prior conditioning of the chip allows the wettability of the surface of the membrane to be increased and good adhesion with the solution of molecule to be crystallised to be guaranteed.

The invention also relates to a method for crystallising a molecule to be crystallised, characterised in that it comprises the following successive steps:

a) A solution S1 comprising the molecule to be crystallised is added into the dialysis chamber 113 of the microfluidic chip 1 according to the invention and then advantageously the dialysis chamber 113 is sealed.

b) If necessary, a solution S2 is continuously injected into the channels of said microfluidic chip 1, said solution S2 containing only the buffer, the injection pressure at the microfluidic channel is maintained at less than 400 mbar.

c) A crystallisation solution S3 is continuously injected, into the channels of said microfluidic chip 1, the injection pressure at the microfluidic channel is maintained at less than 400 mbar.

The crystallisation solution S3 contains at least one crystallisation agent and if necessary one or more additives, and optionally a buffer. When the step b) of the method is carried out, the solution S3 comprises the buffer of the solution S2 and at least one crystallisation agent and if necessary one or more additives.

During step b), the buffer present in the solution S2 diffuses into the solution contained in the dialysis chamber Before step b), the buffer is chosen according to the molecule to be crystallised, in particular while taking into consideration the solubility parameters. During step a), the dialysis chamber 113 is advantageously sealed via encapsulation, that is to say, via deposition of a layer 1115 such as a strip of PMMA.

After step a), and advantageously after the injection of a solution into the tank, the dialysis chamber 113, and advantageously the layer of PMMA 1115, is advantageously coated with a layer of KAPTON® adhesive 1116.

During the method, the composition of the solution injected into the tank of the crystallisation cell can comfortably vary (or in other words be adjusted) according to the required quantities of crystallisation agents, if necessary of additives, optionally of buffers during the method. It can therefore change during the crystallisation, in a reversible manner, because of the diffusion, through the dialysis membrane, of the components of the solution injected.

The method according to the invention allows the concentration to be varied by precipitating in the concentration solution or the temperature in each dialysis crystallisation cell 11. According to a first alternative of the crystallisation method, in the case of a protein system with direct solubility (solubility of the protein increasing with the temperature):

During step a), if necessary during step b), the solution contained in the dialysis chamber is at a constant temperature T of the crystallisation cell 11 and at a concentration C1 of the molecule to be crystallised in such a way that the molecule to be crystallised is in the sub-saturation zone (below the solubility curve) of the phase diagram of said molecule to be crystallised established according to the parameters of the concentration of the molecule to be crystallised and of the concentration of crystallisation agent and if necessary of one or more additives; during step b), the buffer present in the solution S2 diffuses into the solution contained in the dialysis chamber and the molecule to be crystallised is still in said sub-saturation zone During step c), said crystallisation solution S3 contains, if necessary in addition to the buffer, at least one crystallisation agent and if necessary one or more additives at a constant concentration P, in such a way that the crystallisation agent and if necessary the additive diffuse into the solution contained in the dialysis chamber and in such a way that the molecule to be crystallised is in the spontaneous nucleation zone or at the upper limit of the metastable zone of the phase diagram of said molecule to be crystallised and seeds of the molecule to be crystallised appear;

And the method then comprises the following successive steps:

d) the temperature of the crystallisation cell 11 is increased to a temperature T2 in such a way that the nucleation is stopped and the molecule to be crystallised is in the metastable zone of the phase diagram of the molecule to be crystallised, e) if too many crystals form during step c), the temperature of the crystallisation cell 11 maybe increased to a temperature >12 in such a way that the molecule to be crystallised is in the sub-saturation zone, just below the solubility curve, again and the excess of small crystals is completely dissolved. Some selected crystals, having greater sizes undergo partial dissolution while avoiding complete dissolution and then grow in the metastable zone via the lowering of the temperature to the temperature T2 f) The crystal seeds are left to grow at the temperature T2 until a first equilibrium point E1, at which the size of the crystals remains constant, is obtained, the concentration of the molecule to be crystallised in the solution contained in the dialysis chamber that is reached thus being the concentration C2, g) The temperature of the crystallisation cell 11 is lowered to a temperature T3, in such a way that the crystals present in the dialysis chamber 113 are still in the metastable zone of the phase diagram of the molecule to be crystallised h) The crystal seeds and the crystals are left to grow at the temperature T3 until a second equilibrium point E2, at which the size of the crystals remains constant, is obtained, the concentration of the molecule to be crystallised in the solution contained in the dialysis chamber that is reached thus being the concentration C3 i) Steps f) to h) are optionally repeated j) The chip containing the crystals obtained after step h) or i) is recovered for the X-ray diffraction experiment in situ.

According to a second alternative of the crystallisation method:

During step a), if necessary during step b), the solution contained in the dialysis chamber is at a constant temperature T of the crystallisation cell 11 and at a concentration C1 of the molecule to be crystallised in such a way the molecule to be crystallised is in the sub-saturation zone (below the solubility curve) of the phase diagram of said molecule to be crystallised established according to the parameters of the concentration of the molecule to be crystallised and of the concentration of crystallisation agent and if necessary of additive; during step b), the buffer present in the solution S2 diffuses into the solution contained in the dialysis chamber and the molecule to be crystallised is still in said sub-saturation zone During step c), said crystallisation solution S3 contains, if necessary in addition to the buffer, at least one crystallisation agent and if necessary one or more additives at a concentration P1 in the tank of the crystallisation cell, in such a way that the crystallisation agent and if necessary the additive diffuses into the solution contained in the dialysis chamber and in such a way that the molecule to be crystallised is in the spontaneous nucleation zone or at the upper limit of the metastable zone of the phase diagram of said molecule to be crystallised and seeds of the molecule to be crystallised appear;

In order to obtain the controlled spontaneous nucleation of the crystals, the following procedure is used: using the system for controlling the flows of the fluids, the crystallisation solution S3 is injected in a continuous flow with a concentration gradient of the crystallisation agent and if necessary of additive in such a way that at the concentration P1, only a few crystals are formed.

and the method then comprises the following successive steps:

d) The concentration of the crystallisation agent and if necessary of the additive is reduced to a concentration P2, in such a way that the nucleation is stopped and the molecule to be crystallised is in the metastable zone of said phase diagram of the molecule to be crystallised e) The crystal seeds are left to grow at the concentration P2 of the crystallisation agent and if necessary of the additive until a first equilibrium point E1, at which the size of the crystals remains constant, is obtained, the concentration of the molecule to be crystallised in the solution contained in the dialysis chamber that is reached thus being the concentration C2 f) The concentration of the crystallisation agent and if necessary of the additive is increased to a concentration P3, in such a way that the crystals present in the crystallisation cell 11 are still in the metastable zone of said phase diagram of the molecule to be crystallised, g) The crystal seeds and the crystals are left to grow at the concentration P3 of the crystallisation agent and if necessary of the additive until a second equilibrium point E2, at which the size of the crystals remains constant, is obtained, the concentration of the molecule to be crystallised in the solution contained in the dialysis chamber that is reached is the concentration C3, h) Steps d) to f) are optionally repeated i) The chip containing the crystals obtained after step g) or h) is recovered for the X-ray diffraction experiment in situ.

These methods could be used in parallel on the chip 1, in different cells of crystallisations 11 contained in the chip.

The examples that follow illustrate the invention without limiting it.

EXAMPLES

The following methodologies were used:

Design of the SU8 Mould:

Here, a protocol for making a mould made of SU8 having two levels is explained. This mould is then used for the preparation of the structured blocks made of PDMS.

Design of a Mask for the Lithography:

In order to make a mould made of SU8, there must be one or more masks that are used to define the pattern of the mould. For this, the software CleWin3 was used. It allows networks of channels that can be printed on a transparent sheet, in negative or positive, to be designed. If a plurality of masks are created for the same chip, it is possible to make a mould having a plurality of layers.

A technique for easily aligning the masks maybe used in clewin by drawing squares on one level and smaller squares on another level, thus during alignment the squares simply have to be superimposed

SU-8:

SU8 is a negative photosensitive resin that is a polymer in the form of a viscous liquid. In order to trigger the process of cross-linking, it must be exposed to UVs and then heated. After heating, it must be developed in a bath of PGMEA. All the exposed portions will have solidified, the unexposed portions disappear with the development. Its chemical formula is shown below:

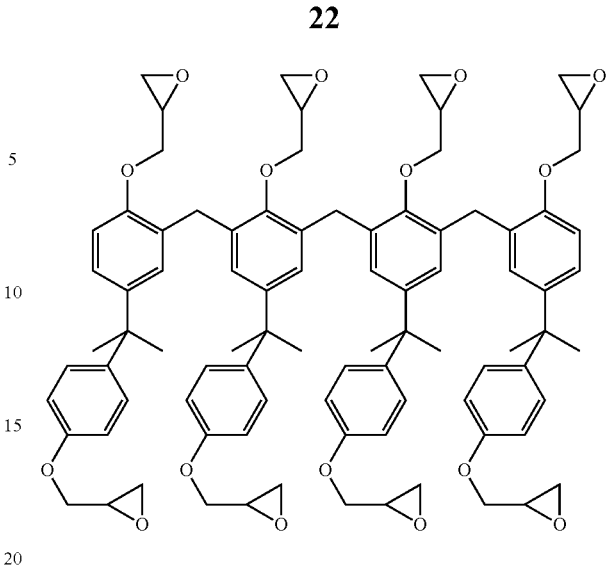

SU8 exists in various series, including in particular the series SU8-20XX and SU8-30XX. The resin is spread on a spin coater before being exposed. According to the resin chosen and the thickness of SU8 desired, there are different programs given by the manufacturer. This resin is generally used in mould design but can also be used to manufacture complete chips.

Design of the Mould:

First of all, the SU8 3000 must be taken out of the refrigerator ahead of time, preferably between 1 to 2 h in such a way that it is at ambient temperature.

The first step, which is rather recurrent, is to clean a wafer of silicon using isopropanol, acetone and then isopropanol again. The surface of the wafer must then be activated with plasma in order to increase the wettability of the surface and guarantee good adhesion with the SU8. For this, the wafer must be deposited in the plasma 45 sec at High Exposure. Create a vacuum up to 500 mTorr. Let in a little nitrogen in order for the vacuum to oscillate between 500 mTorr and 1000 mTorr.

Deposit the wafer on the spin coater (SPIN 150) and centre it. Place 1 mL of SU8 and adjust the SPIN 150 in such a way as to obtain the desired height (cf. Microchem SU-8 3000 Protocol).

Recover the wafer+SU8 and heat it ("Soft Bake", cf. Microchem SU-8 3000 Protocol). The time is dependent on the thickness. It should be noted that with the SU8 2000 resins, a temperature plateau at 65° C. is necessary in order to avoid cracking of the resin. In the context of the SU8 3000, this plateau is not necessary. However, for all the heatings, directly depositing the resin at the maximum temperature is avoided. A location 1-2 cm above the hot plate is taken up and 1 minute passes before completely depositing the wafer on the plate at final temperature. Wait for the cooling (5-15 min).

Tape the $1^{st}$ mask onto the glass plate (below) in such a way as to have the writing in the right direction above on the aligner.

Place the plate in the UV exposer and deposit the wafer under this plate.

The WEC (Wedge Error Compensation) must at first be reduced and then the wafer must be raised using a dedicated lever. What follows relates to the adjustment of the WEC. Adjust the WEC in the program "Settings"→"WEC settings". Raise the plate by using the button of the WEC until the adjustment is completed.

Then, select "Align and expose" with the option "Soft Contact" and the exposure time according to the protocol (cf. Microchem SU-8 3000 Protocol). To do this, the power per cm$^2$ of the lamp must be multiplied by the exposure time in order to find out the energy per cm$^2$ that is deposited. Example in order to obtain 350mJ/cm$^2$ with a power of 35 mW/cm$^2$ a time of 10 seconds is applied: 35 mW/cm$^2$×10 s=350mJ/cm$^2$.

Recover the wafer for the "Post exposure bake." Time indicated on the protocol (cf. Microchem SU-8 3000 Protocol). The appearance of the pattern is observed starting at 15 sec of heating.

The following step involves restarting all the steps from the beginning on the new layer of SU8 (after having let it rest a little after the heating).

Once the step of exposure to the UVs has been reached, there are modifications:

Align the masks, for this roughly place the second mask as best as possible like the one before. Lower the WEC "a little" in order for the block of SU8 to not stick to the mask. Lower the microscope ("microscope is down" should be displayed). Align the microscope on the left and on the right by adjusting: the overall focal distance, the 2 independent focal distances of each microscope, the x and y position, the independent x position of each microscope, the rotation of the 2 microscopes along z.

Once this adjustment has been made, raise the wafer and observe the patterns in the SU8 through the new mask. The goal being to use the drawing tip in CleWin3 by superimposing the alignment marks.

Raise the WEC via the same procedure as above.

Expose for the suitable time, heat "Post exposure bake" and develop in PGMEA (Warning work under a hood!) (cf. Microchem SU-8 3000 Protocol).

Warning: do not overdevelop, otherwise there can be peeling off of the SU8, but there still must be enough development for there to not be white marks. In order to stop the process, take out the wafer from the bath and "abundantly" apply isopropanol. Dry with nitrogen.

Analysis of the Lithographies:

The thicknesses of the lithographies were analysed with a Dektak profilometer. The apparatus has 2 ranges maximum that may be of interest: 65 µm or 252 µm. The length to be analysed, the analysis time, and the type of surface profile intended "hills" or "valleys" must then be chosen.

Example 1: Microchip According to the Invention

A design was created that allows the use, in parallel, of a plurality of conditions and makes possible tests with a temperature gradient.

The solution allowing the implementation of the crystallisation method is introduced into the channels and the protein is deposited in the tank directly "from above" the chip.

In this chip, it is not desired to encapsulate the protein, but it is desired to make the solution allowing the implementation of the crystallisation method flow continuously to the detriment of the encapsulation of the protein that is now deposited by hand or using a robot. In order to prevent any evaporation from the solution of protein, the dialysis chamber is advantageously rapidly sealed via encapsulation, that is to say, via deposition of a layer of PMMA coated with a layer of KAPTON® adhesive, or the entire procedure of filling the chip must be carried out in a chamber with a controlled atmosphere (humidity level and temperature).

A protocol for preparing a chip according to the invention is described below:

First of all, two structured blocks made of PDMS are made. These blocks can be prepared via conventional methods. For example, the following method can be used.

Method for Preparing the Structured Blocks Made of PDMS:

There are 2 types of PDMS having similar characteristics: Sylgard 184 from Dow Corning and RTV 615 from Bayer Silicones.

Mix a ratio of 10:1, by mass, of PDMS:cross-linking agent (in general, for a petri dish, 20 g:2 g) Stir the mixture with a rod in such a way as to homogenise and form bubbles.

Place everything under a vacuum bell jar until total degassing. Make the bubbles rise then wait 10-20 min. Place under a stronger vacuum and degas progressively. Finally, wait for the bubbles to disappear.

Pour the PDMS into the mould

Leave in the oven approximately 1 h.

The mould is the SU8 mould, the preparation method of which is described in the preamble of the examples.

Two blocks of PDMS are made in order to obtain the 3D buffers made of PDMS of the upper portion and of the lower portion of the chip.

Place the block with the channels on a glass slide.

Place a dry dialysis membrane (or a plurality according to the geometry) on the block of PDMS with the channels. The volume of the dialysis chamber is 0.7 µL, the height of the channel is 100 µm, the width of the channel is 500 µm.

The block of PDMS on which the membrane is located must be bigger than the block that will bear on it.

Place the block without channels in a location corresponding to the block with channels in such a way that the membrane is sandwiched therebetween.

Place the assembly under the vacuum bell jar for 30 minutes.

Recover the assembly and then deposit the NOA81® on 3 sides in the space between the 2 blocks of PDMS.

Let the NOA81® fill the space via capillarity.

Once the space is filled (several minutes), place the assembly under the UV lamp.

Carry out a Flood Exposure, 6 sec (lamp 35 mW/cm$^2$, lambda 385 nm) (or 210mJ/cm$^2$ of exposure).

Cut off that which is stuffed with NOA81®.

Remove the upper portion made of PDMS with the assembly made of NOA81® by peeling both together from the lower block of the PDMS.

Reseal the "visible" portion (without PDMS) with a strip of PMMA while progressively evacuating the bubbles. Warning this step can be long because one must be patient in order to not trap any bubbles.

Flood Exposure, 60 sec (same lamp conditions).

Remove the last block of PDMS.

Then clean the buffers by abundantly applying, with a wash bottle, isopropanol, acetone, then isopropanol again. Use scotch tape to remove any possible remaining marks.

During the step in which the membrane is deposited, the two blocks of PDMS must be in corresponding locations. However, in practice, it is very difficult or even impossible to make them correspond perfectly, especially since the pattern of the chip becomes more complex. For this reason, the two blocks are first aligned with the naked eye, then with the optical microscope. However, a non-detrimental offset between the two portions still remains.

Comparative Example 1: Microchip with a Non-Integrated Membrane in the Height of the Inner Walls In this method, a single structured block of PDMS, the one allowing the channels and the tank(s) to be defined, is used.

Prior to this, its lithography must have been prepared and cross-linked PDMS must have been deposited thereon. A second block of PDMS poured onto a bare wafer is necessary.

Cut off the PDMS from the moulded wafer and a "flat" block of PDMS larger than the block with a pattern. From above, deposit a dialysis membrane that is approximately the size of the central tank on the flat block of PDMS, itself placed on a glass slide. Place the block of PDMS with a pattern above by placing the central hole and the membrane in corresponding locations. Degas for 30 min in order to facilitate the next step.

Introduce the NOA81 on 3 of the edges of the chip in order to make it enter via capillarity. Then expose 6 sec in "flood exposure" mode. Recover the assembly and peel off the upper block of PDMS (the one with the patterns). Cut off that which is stuffed with NOA81. Place a glass slide above and expose the assembly 60 sec in "flood exposure" mode. Peel the glass slide off of the PDMS. A system as shown in FIG. 3 is obtained.
This system, however, is not satisfactory since it was observed that the membrane does not resist (peels off) when liquid is poured onto the chip.

Comparative Example 2: Microchip with Encapsulation of the Molecules to be Crystallised In order to achieve all the goals mentioned above, a first design, involving the use of the properties of flow in the channels and in particular the increase of the hydrodynamic resistance when the size of the channel is reduced, was conceived.

This chip is therefore different in that it is desired to encapsulate the protein in order to protect it, in particular in order to prevent any evaporation.

The chip is made with two levels, it is therefore necessary to have 2 masks. The channels have dimensions of 0.5 mm in width with a channel length of the hole for inlet into the central tank of approximately 18.6 mm. The channel supplying the central tank has a width of 0.4 mm and a length of 0.1 mm. The central tank has a diameter of 3 mm. Two different lithographies were carried out, the first has a height of SU8 of 50 µm per layer, or a total of 100 µm, the second 25 µm per layer for a total thickness of 50 µm.

This design was chosen with the goal of delivering the protein according to the diagram of FIG. 4.

First, the tank must be filled with protein. For this, two diagonally opposite inlets are closed and the liquid is introduced. Once the tank has been filled, two inlets located on the same side are closed and paraffin oil is injected in order to "close" one side of the chip. The process is repeated for the other side of the chip. In the end, there should be a drop of protein encapsulated in the central tank.

From theory, it is known that the hydrodynamic resistance, in the case of rectangular channels, is proportional to the inverse of the product width by height cubed. This thus gives:

$$R \propto \omega \cdot h^3$$

with ω width of the channel in µm
h height of the channel in µm

If a qualitative calculation that only takes into account these parameters is carried out, the ratio of resistance between the channel for inlet of the solution Rsol and the channel for inlet into the tank Rres can be calculated. By assuming a height of 100 µm and using the widths mentioned above for this chip, the following is obtained:

$$\frac{R_{res}}{R_{sol}} \sim 1.25$$

This ratio could be greatly increased by reducing the height of the chip at the channel of the tank, but this greatly complicates the manufacturing.

In practice, different results were obtained. First of all, the tank of protein is not filled without capturing bubbles, once these bubbles are formed it becomes almost impossible to get them out of the tank.

Moreover, the filling of a single channel like in the diagram FIG. 4.B is not possible because of the compressibility of the air. All the channels are therefore filled, with a preference, however, for the non-plugged channels.

Finally, during the closing step, the lines of currents of the paraffin oil pass through the central tank and replace the solution of protein (solution of colorant in our diagram) with the oil. This effect can be interpreted in terms of wetting. Indeed, by depositing a drop of water and a drop of oil on the surface of a chip made of NOA81®, it is clearly observed that the angle of contact e(oil) is smaller than the angle of contact e(water). This manifests itself as a better affinity of the oil with respect to the NOA81® than the water. Thus, the oil always prefers to conform as much as possible to the NOA81® compared to the water and thus displaces the water out of the central tank.

The invention claimed is:

1. A microfluidic chip comprising at least one dialysis crystallisation cell, said cell comprising:
   a substrate made of PMMA;
   a first level comprising a tank defined at least partially by said substrate and by an outer wall of the cell, said tank being in fluid communication with a channel for inlet and a channel for outlet of a solution allowing a crystallisation method to be implemented; and
   a second level comprising a dialysis chamber defined at least partially by an inner wall of the cell without contact with the substrate and by a dialysis membrane forming an interface between the tank and the dialysis chamber, the inner wall comprising at least one one-piece portion in which the periphery of said membrane is kept sealed, an upper face and a lower face of the periphery of the membrane being sealed in the same one-piece portion of the inner wall formed from a transparent photosensitive resin, the periphery of the membrane being integrated into said one-piece portion, the membrane being fixed by non-chemical gluing on the transparent photosensitive resin.

2. The microfluidic chip according to claim 1, wherein the dialysis chamber contains a solution of molecule to be crystallised and wherein the dialysis chamber is sealed by a layer made of PMMA.

3. The microfluidic chip according to claim 1 wherein there is a space between the outer walls and inner walls opening onto a main surface of the chip and wherein this space, at the surface of the chip, is connected via a connector to a system for controlling the flows of the fluids.

4. The microfluidic chip according to claim 1 wherein the dialysis membrane is made of cellulose.

5. The microfluidic chip according to claim 1, wherein the volume of the dialysis chamber is between 0.1 and 1 μL.

6. The microfluidic chip according to claim 1 wherein the microfluidic chip comprises a plurality of dialysis crystallisation cells aligned in lines and columns.

7. A method for preparing the microfluidic chip according to claim 1, said method comprising successively:
carrying out two structured blocks made of cross-linked polymer permeable to air PL in order to obtain 3D buffers made of said polymer PL of an upper portion to define the dialysis chamber and of a lower portion of the chip to define channels and tank(s);
on the structured block with the channels and the tank(s), depositing one or more dry dialysis membranes;
placing the structured block without channels in a location corresponding to the structured block with the channels in such a way that the membrane is sandwiched therebetween;
depositing a transparent photosensitive resin in between the structured blocks, configured to be cross-linkable in several seconds and whose photopolymerisation of free radicals is inhibited by oxygen, on three sides between the two structured blocks and then initiating the crosslinking of said transparent photosensitive resin, so that an upper face and a lower face of the periphery of the membrane are sealed by non-chemical gluing on the transparent photosensitive resin;
removing the upper portion of the structured block with an assembly made of cross-linked resin by peeling both together from the lower structured block;
resealing the visible portion with a strip of PMMA;
finalising the cross-linking of said transparent photosensitive resin; and
removing the last structured block.

8. A device for crystallising a molecule to be crystallised, said device comprising:
at least one microfluidic chip according to claim 1;
at least one addition element configured to add, into the dialysis chamber, a solution S1 comprising the molecule to be crystallised and optionally at least one buffer;
at least one element configured to add/remove at least one of a crystallisation agent, of an additive(s), or a buffer (s) in the channels leading to the chamber of the tank;
at least one controller configured to control the chemical composition of the solution in the tank, for varying the concentration of the buffers, of the crystallisation agents, and of the additives;
at least one means regulator configured to regulate the temperature of the microfluidic chip according to claim 1; and
at least one imager.

9. The crystallisation method according to claim 8, wherein:
during said adding the solution S2, if necessary during said continuously injecting the solution S2, the solution contained in the dialysis chamber is at a constant temperature T of the crystallisation cell and at a concentration C1 of the molecule to be crystallised in such a way the molecule to be crystallised is in the sub-saturation zone of the phase diagram of said molecule to be crystallised established according to the parameters of the concentration of the molecule to be crystallised and of the concentration of crystallisation agent and if necessary of additive;

during said continuously injecting the solution S2, the buffer present in the solution S2 diffuses into the solution contained in the dialysis chamber and the molecule to be crystallised is still in said sub-saturation zone;

during said continuously injecting the crystallisation solution S3, said crystallisation solution S3 contains, if necessary in addition to the buffer, at least one crystallisation agent and if necessary one or more additives at a concentration P1 in the tank of the crystallisation cell, in such a way that the crystallisation agent and if necessary the additive diffuses into the solution contained in the dialysis chamber and in such a way that the molecule to be crystallised is in the spontaneous nucleation zone or at the upper limit of the metastable zone of the phase diagram of said molecule to be crystallised and in such a way that seeds of the molecule to be crystallised appear;

in order to obtain the controlled spontaneous nucleation of the crystals, the following procedure is used: using a system for controlling the flows of the fluids, the crystallisation solution S3 is injected in a continuous flow with a concentration gradient of the crystallisation agent and if necessary of additive in such a way that at the concentration P1, only a few crystals are formed;

and the method then comprises successively:
reducing the concentration of the crystallisation agent and if necessary of the additive to a concentration P2, in such a way that the nucleation is stopped and the molecule to be crystallised is in the metastable zone of said phase diagram of the molecule to be crystallised;

leaving the crystal seeds to grow at the concentration P2 of the crystallisation agent and if necessary of the additive until a first equilibrium point E1, at which the size of the crystals remains constant, is obtained, the concentration of the molecule to be crystallised in the solution contained in the dialysis chamber that is reached thus being the concentration C2;

increasing the concentration of the crystallisation agent and if necessary of the additive to a concentration P3, in such a way that the crystals present in the crystallisation cell are still in the metastable zone of said phase diagram of the molecule to be crystallised;

leaving the crystal seeds and the crystals to grow at the concentration P3 of the crystallisation agent and if necessary of the additive until a second equilibrium point E2, at which the size of the crystals remains constant, is obtained, the concentration of the molecule to be crystallised in the solution contained in the dialysis chamber that is reached thus being the concentration C3;

optionally repeating said reducing the concentration of the crystallisation agent and if necessary of the additive to the concentration P2, said leaving the crystal seeds to grow at the concentration P2 of the crystallisation agent and if necessary of the additive until the first equilibrium point E1, and said increasing the concentration of the crystallisation agent and if necessary of the additive to the concentration P3; and after either
　leaving the crystal seeds and the crystals to grow at the concentration P3 of the crystallisation agent and if necessary of the additive until the second equilibrium point E2, or
　said optionally repeating said reducing the concentration of the crystallisation agent and if necessary of the additive to the concentration P2, said leaving the crystal seeds to grow at the concentration P2 of the crystallisation agent and if necessary of the additive until the first equilibrium point E1, and said increasing the concentration of the crystallisation agent and if necessary of the additive to the concentration P3,
　recovering the chip containing the crystals obtained for an X-ray diffraction experiment in situ.

10. The device of claim 8, further comprising at least one device configured to measure the concentration of the molecule to be crystallised in the solution S1.

11. A method for crystallising a molecule to be crystallised, said method comprising successively:
　adding a solution S1 comprising the molecule to be crystallised into the dialysis chamber of the microfluidic chip according to claim 1 and then encapsulating the dialysis chamber;
　if necessary, continuously injecting a solution S2 into channels of said microfluidic chip, said solution S2 containing only a buffer, during which an injection pressure at the microfluidic channel is maintained at less than 400mbar;
　continuously injecting a crystallisation solution S3 into the channels of said microfluidic chip, during which the injection pressure at the microfluidic channel is maintained at less than 400mbar; and
　recovering the chip containing crystals for an X-ray diffraction experiment in situ of the crystals formed in the dialysis chamber,
　wherein
　the crystallisation solution S3 contains at least one crystallisation agent and if necessary one or more additives, and optionally a buffer, and
　the solution S3 comprises the buffer of the solution S2 and at least one crystallisation agent and if necessary one or more additives.

12. The crystallisation method according to claim 11, wherein during said adding the solution S1 the dialysis chamber is encapsulated via deposition of a strip of PMMA, then a polyimide film coating.

13. The crystallisation method according to claim 11, wherein:
　during said adding the solution S1, if necessary during said continuously injecting the solution S2, the solution contained in the dialysis chamber, comprising said molecule to be crystallised, is at a first temperature T1 and at a concentration C1 of the molecule to be crystallised in such a way that the molecule to be crystallised is in the sub-saturation zone of the phase diagram of said molecule to be crystallised established according to parameters of the concentration of the molecule to be crystallised and the temperature;
　during said continuously injecting the solution S2, the buffer present in the solution S2 diffuses into the solution contained in the dialysis chamber and the molecule to be crystallised is still in said sub-saturation zone;
　during said continuously injecting the crystallisation solution S3, said crystallisation solution S3 contains, if necessary in addition to the buffer at least one crystallisation agent and if necessary one or more additives at a constant concentration P, in such a way that the crystallisation agent and if necessary the additive diffuse into the solution contained in the dialysis chamber and in such a way that the molecule to be crystallised is in the spontaneous nucleation zone or at the upper limit of the metastable zone of the phase diagram of said molecule to be crystallised and in such a way that seeds of the molecule to be crystallised appear;

and the method then comprises successively:

increasing the temperature of the crystallisation cell to a temperature T2 in such a way that the nucleation is stopped and the molecule to be crystallised is in the metastable zone of the phase diagram of the molecule to be crystallised;

if too many crystals form during said continuously injecting the crystallisation solution S3, increasing the temperature of the crystallisation cell to a temperature >T2 in such a way that the molecule to be crystallised is in the sub-saturation zone, just below the solubility curve, again and the excess of small crystals is completely dissolved, some selected crystals, having greater sizes undergo partial dissolution while avoiding complete dissolution and then grow in the metastable zone via the lowering of the temperature to the temperature T2;

leaving the crystal seeds to grow at the temperature T2 until a first equilibrium point E1, at which the size of the crystals remains constant, is obtained, the concentration of the molecule to be crystallised in the solution contained in the dialysis chamber that is reached thus being the concentration C2;

lowering the temperature of the crystallisation cell to a temperature T3, in such a way that the crystals present in the dialysis chamber are still in the metastable zone of the phase diagram of the molecule to be crystallised;

leaving the crystal seeds and the crystals to grow at the temperature T3 until a second equilibrium point E2, at which the size of the crystals remains constant, is obtained, the concentration of the molecule to be crystallised in the solution contained in the dialysis chamber that is reached thus being the concentration C3;

optionally repeating said leaving the crystal seeds to grow at the temperature T2 until the first equilibrium point E1, said lowering the temperature of the crystallisation cell to the temperature T3, and said leaving the crystal seeds and the crystals to grow at the temperature T3 until the second equilibrium point E2; and after either said lowering the temperature of the crystallisation cell to the temperature T3 or said leaving the crystal seeds to grow at the temperature T2 until the first equilibrium point E1, said lowering the temperature of the crystallisation cell to the temperature T3, and said leaving the crystal seeds and the crystals to grow at the temperature T3 until the second equilibrium point E2, recovering the chip containing the crystals obtained for the X-ray diffraction experiment in situ.

14. The microfluidic chip according to claim 1 wherein the dialysis membrane is made of regenerated cellulose.

* * * * *